(12) United States Patent
Shin et al.

(10) Patent No.: US 11,735,241 B2
(45) Date of Patent: Aug. 22, 2023

(54) MAGNETIC MEMORY DEVICE AND METHOD FOR FABRICATING THE SAME

(71) Applicant: Samsung Electronics Co., Ltd., Suwon-si (KR)

(72) Inventors: Hee Ju Shin, Seoul (KR); Sang Hwan Park, Hwaseong-si (KR); Se Chung Oh, Yongin-si (KR); Ki Woong Kim, Hwaseong-si (KR); Hyeon Woo Seo, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 31 days.

(21) Appl. No.: 17/202,648

(22) Filed: Mar. 16, 2021

(65) Prior Publication Data
US 2022/0020409 A1    Jan. 20, 2022

(30) Foreign Application Priority Data

Jul. 14, 2020    (KR) .................. 10-2020-0086510

(51) Int. Cl.
| | |
|---|---|
| G11C 11/00 | (2006.01) |
| G11C 11/16 | (2006.01) |
| H01F 10/32 | (2006.01) |
| H10N 50/01 | (2023.01) |
| H10N 50/10 | (2023.01) |
| H10N 50/80 | (2023.01) |
| H10N 50/85 | (2023.01) |

(52) U.S. Cl.
CPC ........ *G11C 11/161* (2013.01); *H01F 10/3286* (2013.01); *H10N 50/01* (2023.02); *H10N 50/10* (2023.02); *H10N 50/80* (2023.02); *H10N 50/85* (2023.02)

(58) Field of Classification Search
CPC ....... G11C 11/161; H01L 43/02; H01L 43/08; H01L 43/10; H01L 43/12; H01F 10/3286
See application file for complete search history.

(56) References Cited

U.S. PATENT DOCUMENTS

| | | | |
|---|---|---|---|
| 7,002,228 B2 * | 2/2006 | Deak ...................... | G11C 11/16 |
| | | | 257/295 |
| 8,710,603 B2 * | 4/2014 | Jan ......................... | H01L 43/12 |
| | | | 257/421 |
| 8,946,834 B2 * | 2/2015 | Wang .................... | H01F 41/307 |
| | | | 365/158 |

(Continued)

FOREIGN PATENT DOCUMENTS

| KR | 101711741 B1 | 3/2017 |
|---|---|---|
| WO | WO-2018182644 A1 * | 10/2018 |

*Primary Examiner* — Viet Q Nguyen
(74) *Attorney, Agent, or Firm* — Harness, Dickey & Pierce, P.L.C.

(57) ABSTRACT

A magnetic memory device includes a pinned layer, a free layer, a tunnel barrier layer between the pinned layer and the free layer, a first oxide layer spaced apart from the tunnel barrier layer with the free layer therebetween, and a second oxide layer spaced apart from the free layer with the first oxide layer therebetween. The first oxide layer includes an oxide of a first material and may have a thickness of 0.3 Å to 2.0 Å. The second oxide layer may include an oxide of a second material and may have a thickness of 0.1 Å to 5.0 Å. A first oxygen affinity of the first material may be greater than a second oxygen affinity of the second material.

20 Claims, 14 Drawing Sheets

(56) References Cited

U.S. PATENT DOCUMENTS

| | | | |
|---|---|---|---|
| 9,117,995 B2 | 8/2015 | Daibou et al. | |
| 9,859,488 B2 | 1/2018 | Lee et al. | |
| 9,954,164 B2 | 4/2018 | Jeong et al. | |
| 9,966,529 B1* | 5/2018 | Iwata | H01F 10/16 |
| 9,985,200 B2 | 5/2018 | Lee et al. | |
| 10,147,873 B2 | 12/2018 | Lee et al. | |
| 10,396,275 B2 | 8/2019 | Bak et al. | |
| 10,516,095 B2 | 12/2019 | Yamakawa et al. | |
| 10,522,746 B1* | 12/2019 | Sundar | H01L 43/02 |
| 10,665,773 B2* | 5/2020 | Iwata | H01F 41/302 |
| 10,797,225 B2* | 10/2020 | Sundar | G11C 11/161 |
| 10,957,851 B2* | 3/2021 | Jan | H01L 27/224 |
| 11,088,319 B2* | 8/2021 | Kim | H01F 10/3272 |
| 11,114,605 B2* | 9/2021 | Ma | H01L 43/02 |
| 2015/0008547 A1* | 1/2015 | Pi | H01L 43/02 |
| | | | 257/421 |
| 2019/0237661 A1* | 8/2019 | Iwata | H01F 41/302 |
| 2019/0296226 A1 | 9/2019 | Eeh et al. | |
| 2020/0058338 A1 | 2/2020 | Ishikawa et al. | |
| 2022/0131069 A1* | 4/2022 | Hong | H01L 43/12 |

\* cited by examiner

MAGNETIC MEMORY DEVICE AND METHOD FOR FABRICATING THE SAME

CROSS-REFERENCE TO RELATED APPLICATION

This application claims priority from Korean Patent Application No. 10-2020-0086510 filed on Jul. 14, 2020, in the Korean Intellectual Property Office, and all the benefits accruing therefrom under 35 U.S.C. 119, the entire contents of which are herein incorporated by reference.

BACKGROUND

1. Technical Field

The present disclosure relates to a magnetic memory device and/or a method for fabricating the same. More particularly, the present disclosure relates to a magnetic memory device including an oxide layer for inducing interfacial perpendicular magnetic anisotropy (i-PMA) in a free layer and/or a method for fabricating the same.

2. Description of Related Art

As electronic devices become faster and lower in power, memory devices built therein may also require fast read/write operations and low operating voltages. A magnetic memory device is being studied as a memory device that may meet this demand. Magnetic memory devices are in the spotlight as next-generation memories because they are nonvolatile and capable of high-speed operation.

Meanwhile, as magnetic memory elements become increasingly highly integrated, STT-MRAMs that store information using a spin transfer torque (STT) phenomenon are being studied. The STT-MRAM may store information by inducing magnetization inversion by directly applying a current to the magnetic tunnel junction element. The highly integrated STT-MRAM may require a high-speed operation and a low current operation.

SUMMARY

Aspects of the present disclosure provide a magnetic memory device with improved product reliability, performance, and/or distribution.

Aspects of the present disclosure also provide a method for fabricating a magnetic memory device with improved product reliability, performance, and/or distribution.

However, aspects of the present disclosure are not restricted to those set forth herein. The above and other aspects of the present disclosure will become more apparent to one of ordinary skill in the art to which the present disclosure pertains by referencing the detailed description below.

According to an embodiment, a magnetic memory device may include a pinned layer, a free layer, a tunnel barrier layer between the pinned layer and the free layer, a first oxide layer spaced apart from the tunnel barrier layer with the free layer therebetween, and a second oxide layer spaced part from the free layer with the first oxide layer therebetween. The first oxide layer may include an oxide of a first material and may have a thickness of 0.3 Å to 2.0 Å. The second oxide layer may include an oxide of a second material and may have a thickness of 0.1 Å to 5.0 Å. The first material may have a first oxygen affinity. The second material may have a second oxygen affinity. The second oxygen affinity may be less than the first oxygen affinity.

According to an embodiment, a magnetic memory device may include a pinned layer, a free layer, a tunnel barrier layer between the pinned layer and the free layer, a first oxide layer spaced apart from the tunnel barrier layer with the free layer therebetween, and a second oxide layer spaced part from the free layer with the first oxide layer therebetween. The first oxide layer may include a first material including at least one of calcium (Ca), strontium (Sr), magnesium (Mg), hafnium (Hf), zirconium (Zr) and aluminum (Al). The second oxide layer may include a second material different from the first material. The first material may have a first oxygen affinity. The second material may have a second oxygen affinity that may be less than the first oxygen affinity.

According to an embodiment, a magnetic memory device may include a pinned layer, a free layer, a tunnel barrier layer between the pinned layer and the free layer, a first oxide layer spaced apart from the tunnel barrier layer with the free layer therebetween, and a second oxide layer spaced apart from the free layer with the first oxide layer therebetween. The first oxide layer may include a first metal oxide having a first oxide decomposition potential. The second oxide layer may include a second metal oxide different from the first metal oxide. The second metal oxide may have a second oxide decomposition potential that is less than the first oxide decomposition potential.

According to an embodiment, a method for fabricating a magnetic memory device may include forming a pinned layer on a substrate; forming a tunnel barrier layer on the pinned layer; forming a free layer on the tunnel barrier layer; forming a first oxide layer on the free layer, the first oxide layer including an oxide of a first material, the first material having a first oxygen affinity; and forming a second oxide layer on the first oxide layer, the second oxide layer including an oxide of a second material, the second material have a second oxygen affinity that is less than the first oxygen affinity.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, a magnetic tunnel junction element and a magnetic memory device according to some embodiments of the present disclosure will be described with reference to FIGS. 1 to 9.

Figure 1:
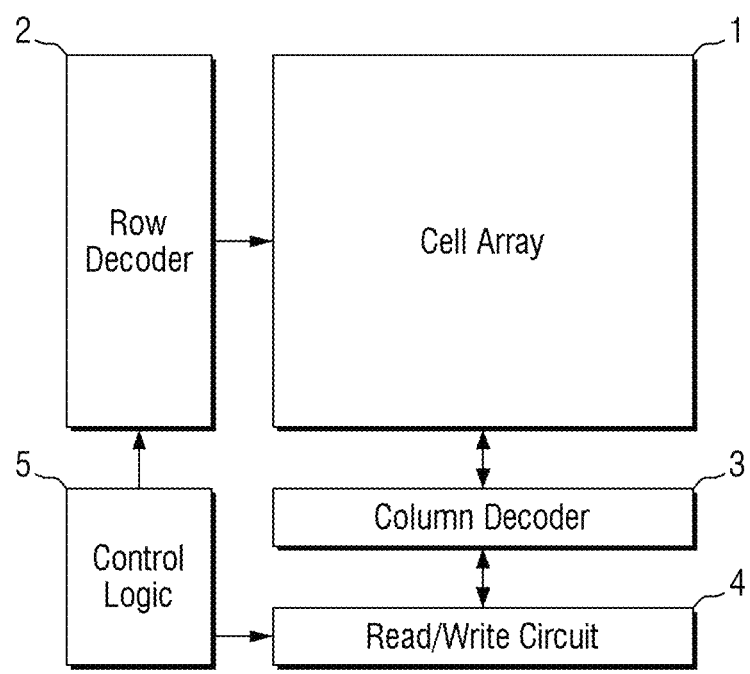
FIG. 1 is an example block diagram of a magnetic memory device according to some embodiments.

FIG. 1 is an example block diagram of a magnetic memory device according to some embodiments.

Referring to FIG. 1, a magnetic memory device according to some embodiments includes a cell array 1, a row decoder 2, a column decoder 3, and a read/write circuit 4, and a control logic 5.

The cell array 1 may include a plurality of word lines and a plurality of bit lines. Memory cells may be connected to points at which the word lines and the bit lines cross each other. The cell array 1 will be described later in more detail with reference to FIG. 2.

The row decoder 2 may be connected to the cell array 1 through the word lines. The row decoder 2 may select one of the plurality of word lines by decoding an externally inputted address.

The column decoder 3 may be connected to the cell array 1 through the bit lines. The column decoder 3 may select one of the plurality of bit lines by decoding an externally inputted address. The bit line selected by the column decoder 3 may be connected to the read/write circuit 4.

The read/write circuit 4 may provide a bit line bias for accessing the selected memory cell under the control of the control logic 5. For example, the read/write circuit 4 may provide a bit line bias to the selected bit line to write or read input data into or from a memory cell.

In some embodiments, the control logic 5, row decoder 2, and column decoder 3 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The control logic 5 may output control signals for controlling the magnetic memory device according to a command signal provided from the outside. The control signals outputted from the control logic 5 may control the read/write circuit 4. The control logic 5 may operate in response to control/command signals, commands, or instructions input thereto from an external source (e.g., host, not shown) a host (not shown) and may be configured to access the cell array 1 and control operations of the magnetic memory device discussed herein, thereby transforming the control logic 5 into a special purpose controller.

Figure 2:
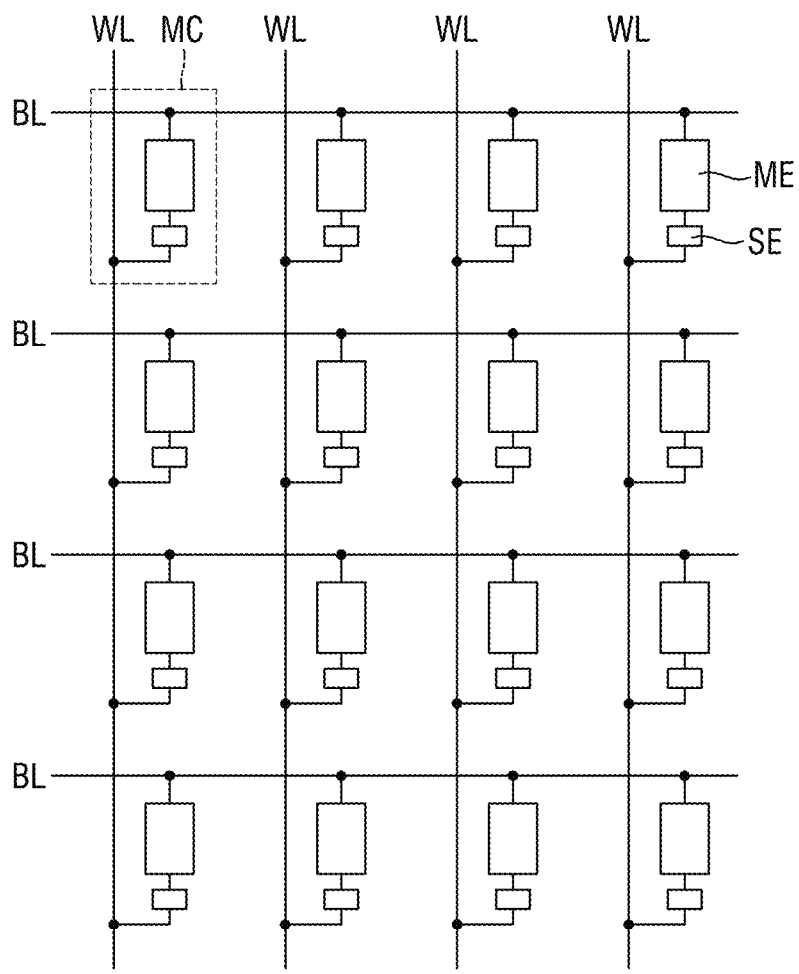
FIG. 2 is an example circuit diagram of a cell array of a magnetic memory device according to some embodiments.
Figure 3:
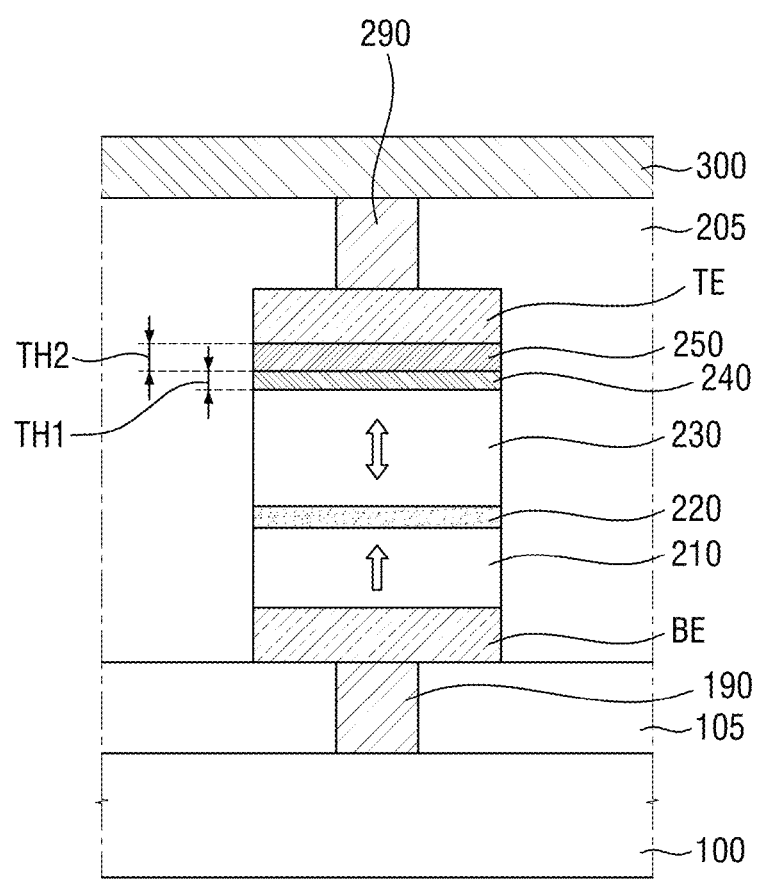
FIGS. 3 and 4 are schematic cross-sectional views illustrating a magnetic tunnel junction element of a magnetic memory device according to some embodiments.
Figure 4:
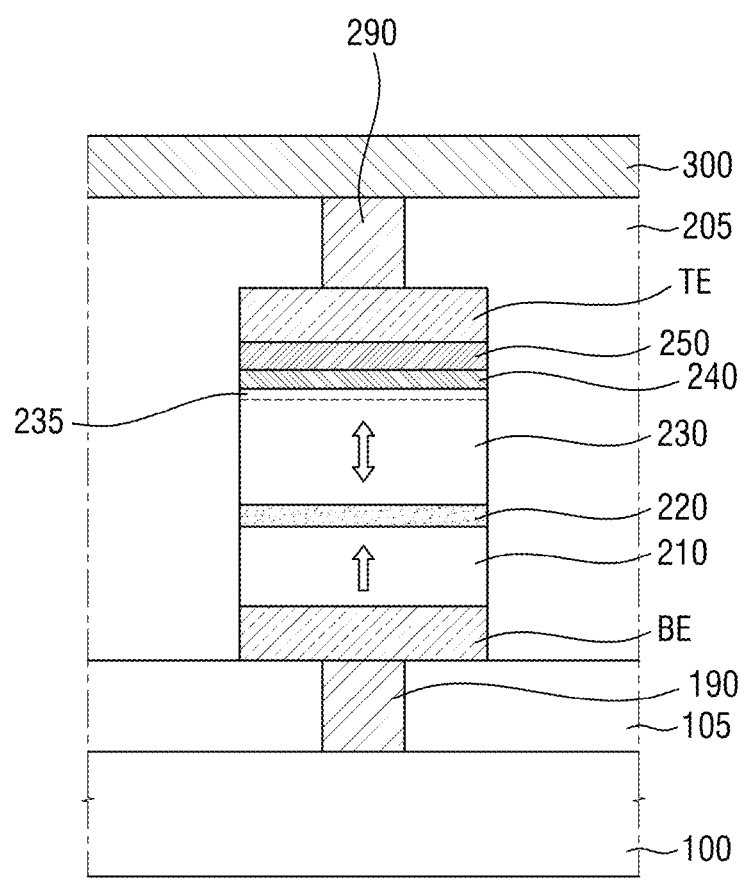

FIG. 2 is an example circuit diagram of a cell array of a magnetic memory device according to some embodiments. FIGS. 3 and 4 are schematic cross-sectional views illustrating a magnetic tunnel junction element of a magnetic memory device according to some embodiments. For reference, FIGS. 3 and 4 are examples of a magnetic memory device constituting a spin transfer torque magnetic random access memory (STT-MRAM).

Referring to FIG. 2, the cell array 1 includes a plurality of bit lines BL, a plurality of word lines WL, and a plurality of unit memory cells MC.

The word lines WL may extend in a first direction. The bit lines BL may extend in a second direction crossing the first direction to cross the word lines WL.

The unit memory cells MC may be arranged two-dimensionally or three-dimensionally. Each of the unit memory cells MC may be connected to intersections of the word lines WL and the bit lines BL that cross each other. Accordingly, each of the unit memory cells MC connected to the word lines WL may be connected to a read/write circuit (e.g., 40 in FIG. 1) by the bit lines BL. Each of the unit memory cells MC may include a magnetic tunnel junction element ME and a selection element SE.

The magnetic tunnel junction element ME may be connected between the bit line BL and the selection element SE, and the selection element SE may be connected between the magnetic tunnel junction element ME and the word line WL. The magnetic tunnel junction element ME may include a pinned layer (e.g., 210 in FIG. 3), a free layer (e.g., 230 in FIG. 3), and a tunnel barrier layer (e.g., 220 in FIG. 3).

The selection element SE may be configured to selectively control the flow of electric charges through the magnetic tunnel junction element ME. For example, the selection element SE may include at least one of a diode, a PNP bipolar transistor, an NPN bipolar transistor, an NMOS field effect transistor, or a PMOS field effect transistor. When the selection element SE is constituted with a bipolar transistor that is a 3-terminal element or an MOS field effect transistor, an additional wire (e.g., a source line) may be connected to the selection element SE.

Referring to FIGS. 3 and 4, a magnetic tunnel junction element of a magnetic memory device according to some embodiments includes the pinned layer 210, the free layer 230, the tunnel barrier layer 220, a first oxide layer 240, and a second oxide layer 250.

The pinned layer 210 may have a pinned magnetization direction. For example, the magnetization direction of the pinned layer 210 may be pinned regardless of a program current passing therethrough.

The pinned layer 210 may include a ferromagnetic substance. For example, the pinned layer 210 may include at least one of an amorphous rare earth element alloy, a multilayer thin film in which a ferromagnetic metal (FM) and a nonmagnetic metal (NM) are stacked alternately, an alloy having an $L1_0$ type crystal structure, a cobalt-based alloy, or a combination thereof, but is not limited thereto.

The amorphous rare earth element alloy may include, for example, an alloy such as TbFe, TbCo, TbFeCo, DyTbFeCo, and GdTbCo. The multilayer thin film in which the ferromagnetic metal (FM) and the nonmagnetic metal (NM) are stacked alternately may include, for example, a multilayer thin film such as Co/Pt, Co/Pd, CoCr/Pt, Co/Ru, Co/Os, Co/Au, and Ni/Cu. The alloy having the $L1_0$ type crystal structure may include, for example, an alloy such as Fe$_{50}$Pt$_{50}$, Fe$_{50}$Pd$_{50}$, Co$_{50}$Pt$_{50}$, Fe$_{30}$Ni$_{20}$Pt$_{50}$, and Co$_{30}$Ni$_{20}$Pt$_{50}$. The cobalt-based alloy may include, for example, an alloy such as CoCr, CoPt, CoCrPt, CoCrTa, CoCrPtTa, CoCrNb, and CoFeB. For example, an example will be described below where the pinned layer 210 includes CoFeB.

In some embodiments, the pinned layer 210 may have perpendicular magnetic anisotropy (PMA). That is, the pinned layer 210 may have a magnetization easy axis in a direction perpendicular to the extension direction of the pinned layer 210. A one-way arrow A in FIG. 3 indicates that the magnetization direction of the pinned layer 210 is vertically pinned.

The free layer 230 may have a variable magnetization direction. For example, the magnetization direction of the free layer 230 may vary according to a program current passing therethrough. In some embodiments, the magnetization direction of the free layer 230 may be changed by a spin transfer torque (STT).

The free layer 230 may include at least one magnetic element. Regarding the magnetic element, for example, the free layer 230 may include at least one of iron (Fe), nickel (Ni), or cobalt (Co), but is not limited thereto.

In some embodiments, the free layer 230 may have perpendicular magnetic anisotropy (PMA). That is, the free layer 230 may have a magnetization easy axis in a direction perpendicular to the extension direction of the free layer 230. A double-way arrow B of FIG. 3 indicates that the magnetization direction of the free layer 230 may be magnetized parallel to or may be magnetized antiparallel, to the magnetization direction of the pinned layer 210.

In some embodiments, the free layer 230 may include a magnetic element capable of inducing interfacial perpendicular magnetic anisotropy (i-PMA) by combining with oxygen. The magnetic element may be, for example, iron (Fe). For example, the free layer 230 will be described below as including CoFe or CoFeB.

In some embodiments, the free layer 230 may have a crystalline structure. For example, at least a portion of the free layer 230 may have a body-centered cubic (BCC) crystal structure.

The tunnel barrier layer 220 may be interposed between the pinned layer 210 and the free layer 230. The tunnel barrier layer 220 may function as an insulated tunnel barrier for generating quantum mechanical tunneling between the pinned layer 210 and the free layer 230.

The tunnel barrier layer 220 may include, for example, at least one of magnesium oxide (MgO), aluminum oxide (Al$_2$O$_3$), silicon oxide (SiO$_2$), tantalum oxide (Ta$_2$O$_5$), silicon nitride (SiN), aluminum nitride (AlN), or a combination thereof, but is not limited thereto. For example, the tunnel barrier layer 220 will be described below as including magnesium oxide having a face-centered cubic (FCC) crystal structure, or a sodium chloride (NaCl) crystal structure.

The magnetic tunnel junction element including the pinned layer 210, the tunnel barrier layer 220, and the free layer 230 may function as a variable resistance element that may be switched to two resistance states by an electrical signal (e.g., a program current) applied thereto. For example, when the magnetization direction of the pinned layer 210 and the magnetization direction of the free layer 230 are parallel, the magnetic tunnel junction element may have a low resistance value and may store this as data '0'. Conversely, when the magnetization direction of the pinned layer 210 and the magnetization direction of the free layer 230 are antiparallel, the magnetic tunnel junction element has a high resistance value and may store this as data '1'.

In some embodiments, the pinned layer 210, the tunnel barrier layer 220, and the free layer 230 may be sequentially stacked on the substrate 100. The substrate 100 may be, for example, a silicon substrate, a gallium arsenide substrate, a silicon germanium substrate, a ceramic substrate, a quartz substrate, or a glass substrate for a display, or a semiconductor on insulator (SOI) substrate, but is not limited thereto.

The first oxide layer 240 may be spaced apart from the tunnel barrier layer 220 with the free layer 230 therebetween. For example, the first oxide layer 240 may cover the top surface of the free layer 230. The first oxide layer 240 may be in contact with the free layer 230.

The first oxide layer 240 may include an oxide of a first material. For example, the first oxide layer 240 may be a native oxide of the first material. The first material may have a first oxygen affinity. The first material may include, for example, at least one of a metal such as calcium (Ca), strontium (Sr), beryllium (Be), magnesium (Mg), hafnium (Hf), zirconium (Zr), barium (Ba) and aluminum (Al), boride of the metal (e.g., calcium boride (CaB), aluminum boride (AlB), and zirconium boride (ZrB)), tantalum boride (TaB), titanium boride (TiB), or tantalum carbide (TaC), but is not limited thereto.

The second oxide layer 250 may be spaced apart from the free layer 230 with the first oxide layer 240 therebetween. For example, the second oxide layer 250 may cover the top surface of the first oxide layer 240. In some embodiments, the second oxide layer 250 may be in contact with the first free layer 230.

The second oxide layer 250 may include an oxide of a second material. For example, the second oxide layer 250 may be a native oxide of the second material. The second material may have a second oxygen affinity. The second material may include, for example, at least one of titanium (Ti), tantalum (Ta), gallium (Ga), vanadium (V), zinc (Zn), manganese (Mn), or niobium (Nb), but is not limited thereto. In some embodiments, the second material may be different from the first material.

The first oxygen affinity of the first oxide layer 240 may be greater than the second oxygen affinity of the second oxide layer 250. For example, a first oxide decomposition potential of the oxide of the first material may be greater than a second oxide decomposition potential of the oxide of the second material. A difference between the first oxide decomposition potential and the second oxide decomposition potential may be 0.1 V or more (e.g., 0.1 V to 2.0 V and/or 0.1 V to 1.55 V). Here, the oxide decomposition potential means an absolute value of a decomposition potential measured in electrolysis of an oxide.

Table 1 below illustrates the known oxide decomposition potentials for several metals at 1300K.

TABLE 1

| Oxide | Oxide Decomposition Potential (−E°) [V] |
|---|---|
| ZnO | 1.052 |
| V$_2$O$_5$ | 1.069 |
| Ga$_2$O$_3$ | 1.146 |
| VO$_2$ | 1.302 |
| Ta$_2$O$_5$ | 1.529 |
| V$_2$O$_3$ | 1.544 |
| VO | 1.638 |
| TiO$_2$ | 1.822 |

TABLE 1-continued

| Oxide | Oxide Decomposition Potential (−E°) [V] |
|---|---|
| $Ti_2O_3$ | 2.007 |
| $Al_2O_3$ | 2.179 |
| $ZrO_2$ | 2.207 |
| $HfO_2$ | 2.274 |
| MgO | 2.376 |
| SrO | 2.459 |
| CaO | 2.590 |

For example, the first material may be calcium (Ca), and the second material may be tantalum (Ta). That is, the first oxide layer 240 may include calcium oxide (CaO), and the second oxide layer 250 may include tantalum oxide ($Ta_2O_5$). Referring to Table 1 above, the oxide decomposition potential (about 2.590 V) of calcium (Ca) at 1300K is greater than the oxide decomposition potential (about 1.529 V) of tantalum (Ta) at 1300K. Accordingly, the first oxygen affinity of the first oxide layer 240 may be greater than the second oxygen affinity of the second oxide layer 250.

In some embodiments, the first material may be a first metal, and the second material may be a second metal different from the first metal. For example, the first oxide layer 240 may include a first metal oxide, and the second oxide layer 250 may include a second metal oxide different from the first metal oxide. In this case, the first oxide decomposition potential of the first metal oxide may be greater than the second oxide decomposition potential of the second metal oxide.

In some embodiments, at 1300K, the first oxide decomposition potential of the first metal oxide may be 2.1 V or more, and the second oxide decomposition potential of the second metal oxide may be 2.0 V or less.

In some embodiments, the first metal oxide may include at least one element of calcium (Ca), strontium (Sr), magnesium (Mg), hafnium (Hf), zirconium (Zr), or aluminum (Al). That is, the first oxide layer 240 may include at least one of calcium oxide (CaO), strontium oxide (SrO), magnesium oxide (MgO), hafnium oxide ($HfO_2$), zirconium oxide ($ZrO_2$), or aluminum oxide (AlO).

In some embodiments, the second metal oxide may include at least one of titanium (Ti), tantalum (Ta), gallium (Ga), vanadium (V), or zinc (Zn). That is, the second oxide layer 250 may include at least one of titanium oxide ($TiO_2$, $Ti_2O_3$), tantalum oxide ($Ta_2O_5$), gallium oxide ($Ga_2O_3$), vanadium oxide (VO, $V_2O_3$, $VO_2$, $V_2O_5$), or zinc oxide (ZnO).

The second oxide layer 250 may supply oxygen atoms to the interface between the free layer 230 and the first oxide layer 240. The oxygen atoms supplied from the second oxide layer 250 may be combined with magnetic atoms (e.g., iron (Fe) atoms) of the free layer 230 to induce interfacial perpendicular magnetic anisotropy (i-PMA). For example, as illustrated in FIG. 4, the free layer 230 may include an interfacial layer 235 in contact with the first oxide layer 240. The interfacial layer 235 may bond with oxygen atoms supplied from the second oxide layer 250 to induce interfacial perpendicular magnetic anisotropy (i-PMA). In some embodiments, the interfacial layer 235 may include iron-oxygen (Fe—O) bonds.

The first oxide layer 240 may control oxygen atoms supplied from the second oxide layer 250 to the free layer 230. Since the first oxide layer 240 has a greater oxygen affinity than the second oxide layer 250, and the first oxide layer 240 may limit and/or prevent oxygen atoms from excessively diffusing inside the free layer 230 and/or into the tunnel barrier layer 220. In addition, the first oxide layer 240 and the second oxide layer 250 may be bonded to each other, so that oxygen atoms may be controlled to be uniformly provided to the free layer 230.

In some embodiments, a thickness TH1 of the first oxide layer 240 may be 0.3 Å to 2.0 Å. When the thickness TH1 of the first oxide layer 240 is less than 0.3 Å, oxygen atoms supplied from the second oxide layer 250 to the free layer 230 may not be controlled. Accordingly, oxygen atoms may excessively diffuse inside the free layer 230 and/or into the tunnel barrier layer 220, and the characteristics of the magnetic tunnel junction element (e.g., retention, coercive force (Hc), resistance-area product (RA), and tunneling magnetoresistance ratio (TMR ratio), or the like) may be deteriorated. When the thickness TH1 of the first oxide layer 240 exceeds 2.0 Å, sufficient oxygen atoms are not supplied to the free layer 230. Accordingly, interfacial perpendicular magnetic anisotropy (i-PMA) may not be sufficiently induced at the interface between the free layer 230 and the first oxide layer 240.

In some embodiments, the thickness TH2 of the second oxide layer 250 may be 0.1 Å to 5.0 Å. When the thickness TH2 of the second oxide layer 250 is less than 0.1 Å, sufficient oxygen atoms are not supplied to the free layer 230. Accordingly, interfacial perpendicular magnetic anisotropy (i-PMA) may not be sufficiently induced at the interface between the free layer 230 and the first oxide layer 240. When the thickness TH2 of the second oxide layer 250 exceeds 5.0 Å, a switching current excessively increases. Accordingly, a low current operation of the magnetic tunnel junction element may not be achieved.

In order to improve the thermal stability of the magnetic memory device, interfacial perpendicular magnetic anisotropy (i-PMA) may be induced by supplying oxygen atoms to the interface of the free layer. However, when oxygen atoms excessively diffuse inside the free layer and/or into the tunnel barrier layer, the oxygen concentration in the free layer and/or the tunnel barrier layer increases, the characteristics (e.g., retention, coercive force (Hc), resistance-area product (RA), tunneling magnetoresistance ratio (TMR ratio), etc.) of the magnetic tunnel junction element may be deteriorated.

However, the magnetic tunnel junction element of the magnetic memory device according to some embodiments may limit and/or prevent deterioration of characteristics of the magnetic tunnel junction element by controlling oxygen atoms supplied to the interface of the free layer 230. For example, as described above, since the first oxide layer 240 has a greater oxygen affinity than the second oxide layer 250, and the first oxide layer 240 may limit and/or prevent oxygen atoms from excessively diffusing inside the free layer 230 and/or into the tunnel barrier layer 220. Accordingly, a magnetic memory device with improved product reliability and performance may be provided by limiting and/or preventing deterioration in characteristics of the magnetic tunnel junction element.

In addition, in the magnetic tunnel junction element of the magnetic memory device according to some embodiments, uniform interfacial perpendicular magnetic anisotropy (i-PMA) may be provided at the interface (e.g., the interfacial layer 235) between the free layer 230 and the first oxide layer 240. For example, the first oxide layer 240 and the second oxide layer 250 may be bonded to each other, so that oxygen atoms may be controlled to be uniformly provided to the free layer 230. Accordingly, a magnetic memory device in which distribution of interfacial perpendicular magnetic anisotropy is improved may be provided.

In some embodiments, the first oxide layer 240 may further include boron (B). For example, the first oxide layer 240 may include at least one of calcium boride (CaB), aluminum boride (AlB), zirconium boride (ZrB), tantalum boride (TaB), or titanium boride (TiB). In some embodiments, the boride formation energy of the first oxide layer 240 may be lower than the boride formation energy of the free layer 230.

In some embodiments, the free layer 230 may include a crystalline portion and an amorphous portion. For example, the crystalline portion of the free layer 230 may be adjacent to the tunnel barrier layer 220, and the amorphous portion of the free layer 230 may be adjacent to the first oxide layer 240. In some embodiments, the boron concentration of the amorphous portion (e.g., the interfacial layer 235) of the free layer 230 may be greater than the boron concentration of the crystalline portion (e.g., the center of the free layer 230) of the free layer 230.

In some embodiments, the (maximum) boron concentration of the first oxide layer 240 may be greater than the (maximum) boron concentration of the free layer 230. For example, the boron concentration in the center of the first oxide layer 240 may be greater than the boron concentration in the amorphous portion (e.g., the interfacial layer 235) of the free layer 230.

In some embodiments, the free layer 230 and/or the first oxide layer 240 may have a uniform boron concentration. In this case, the uniform boron concentration of the first oxide layer 240 may be greater than the uniform boron concentration of the free layer 230. In some embodiments, the free layer 230 may not include boron.

In some embodiments, the boron concentration of the free layer 230 may be 30 at % or less, and the boron concentration of the first oxide layer 240 may be 50 at % or less. In some embodiments, the second oxide layer 250 may not include boron (B).

The magnetic tunnel junction element of the magnetic memory device according to some embodiments may be connected to the substrate 100 and a first wire 300.

For example, a first interlayer insulating layer 105 may be formed on the substrate 100. The pinned layer 210, the tunnel barrier layer 220, the free layer 230, the first oxide layer 240, and the second oxide layer 250 may be sequentially stacked on the first interlayer insulating layer 105. Further, for example, a second interlayer insulating layer 205 may be formed on the first interlayer insulating layer 105. The second interlayer insulating layer 205 may cover the first interlayer insulating layer 105, the pinned layer 210, the tunnel barrier layer 220, the free layer 230, the first oxide layer 240, and the second oxide layer 250. The first wire 300 may be formed on the second interlayer insulating layer 205.

The first interlayer insulating layer 105 and the second interlayer insulating layer 205 may each include an insulating material, for example, silicon oxide or silicon oxynitride, but are not limited thereto.

In some embodiments, a first contact plug 190 may be formed between the magnetic tunnel junction element (e.g., the pinned layer 210) and the substrate 100. The first contact plug 190 may penetrate the first interlayer insulating layer 105 to be connected to the substrate 100. The first contact plug 190 may include, for example, at least one of a doped semiconductor material (e.g., doped silicon), a metal (e.g., tungsten, aluminum, copper, titanium, and/or tantalum), a conductive metal nitride (e.g., titanium nitride, tantalum nitride, and/or tungsten nitride), or a metal-semiconductor compound (e.g., metal silicide), but is not limited thereto.

In some embodiments, a bottom electrode BE may be formed on the first interlayer insulating layer 105. For example, the bottom electrode BE may cover the bottom surface of the pinned layer 210. The bottom electrode BE may be connected to the first contact plug 190. Accordingly, the magnetic tunnel junction element (e.g., the pinned layer 210) may be connected to the substrate 100 through the bottom electrode BE and/or the first contact plug 190.

The bottom electrode BE may include, for example, a conductive metal nitride or a metal. In some embodiments, the bottom electrode BE may function as a seed layer of the pinned layer 210. For example, when the pinned layer 210 is formed of a material having an $L1_0$ type crystal structure, the bottom electrode BE may include a conductive metal nitride (e.g., titanium nitride, tantalum nitride, chromium nitride or vanadium nitride) having a face-centered cubic crystal structure (or a sodium chloride (NaCl) crystal structure). Alternatively, for example, when the pinned layer 210 has a dense hexagonal crystal structure, the bottom electrode BE may include a conductive material (e.g., ruthenium) having a dense hexagonal crystal structure. However, this is only an example, and the bottom electrode BE may include a conductive material (e.g., titanium or tantalum).

In some embodiments, a second contact plug 290 may be formed between the magnetic tunnel junction element (e.g., the second oxide layer 250) and the substrate 100. The second contact plug 290 may penetrate the second interlayer insulating layer 205 to be connected to the first wire 300. The second contact plug 290 may include, for example, at least one of a doped semiconductor material (e.g., doped silicon), a metal (e.g., tungsten, aluminum, copper, titanium, and/or tantalum), a conductive metal nitride (e.g., titanium nitride, tantalum nitride, and/or tungsten nitride), or a metal-semiconductor compound (e.g., metal silicide), but is not limited thereto.

In some embodiments, a top electrode TE may be formed on the second oxide layer 250. For example, the top electrode TE may cover the top surface of the second oxide layer 250. The top electrode TE may be connected to the second contact plug 290. Accordingly, the magnetic tunnel junction element (e.g., the second oxide layer 250) may be connected to the first wire 300 through the top electrode TE and/or the second contact plug 290.

The top electrode TE may include, for example, a conductive metal nitride or a metal. In some embodiments, the top electrode TE may protect the second oxide layer 250. For example, the top electrode TE may include at least one of ruthenium (Ru), tantalum (Ta), or a nitride thereof.

FIGS. 5 to 8 are various schematic cross-sectional views illustrating a magnetic tunnel junction element of a magnetic memory device according to some embodiments. For simplicity of description, a description overlapping with the description with reference to FIGS. 1 to 4 will be briefly given or omitted.

Figure 5:
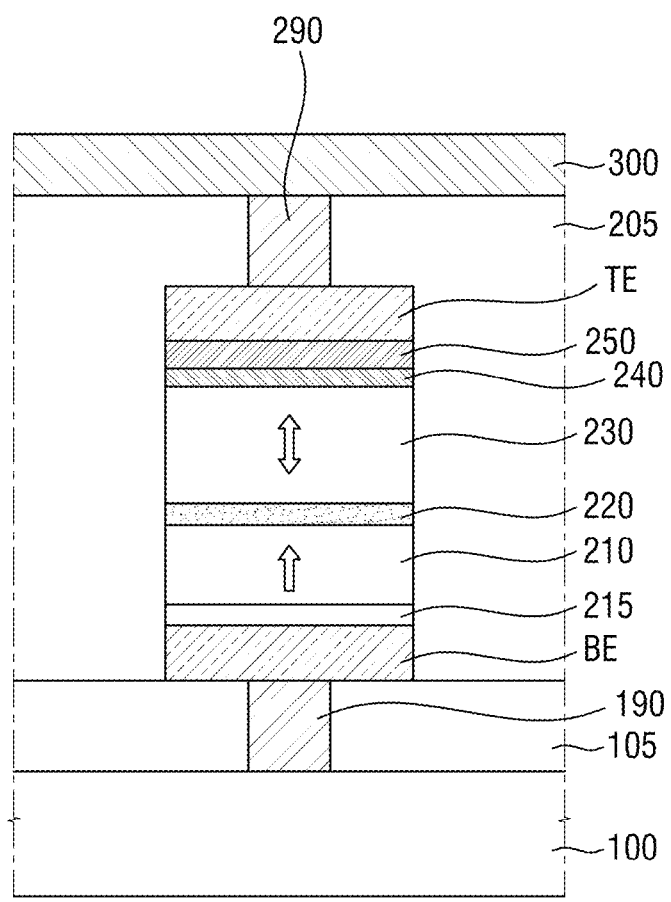
FIGS. 5 to 8 are various schematic cross-sectional views illustrating a magnetic tunnel junction element of a magnetic memory device according to some embodiments.

Referring to FIG. 5, the magnetic memory device according to some embodiments further includes a seed layer 215.

The seed layer 215 may be formed on the substrate 100. In some embodiments, the seed layer 215 may cover the bottom surface of the pinned layer 210. The seed layer 215 may be spaced apart from the tunnel barrier layer 220 with the pinned layer 210 therebetween.

The seed layer 215 may function as a seed layer of the pinned layer 210. For example, when the pinned layer 210 is formed of a material having an $L1_0$ type crystal structure, the seed layer 215 may include a conductive metal nitride (e.g., titanium nitride, tantalum nitride, chromium nitride or vanadium nitride) having a face-centered cubic crystal structure (or a sodium chloride (NaCl) crystal structure). Alternatively, for example, when the pinned layer 210 has a dense hexagonal crystal structure, the seed layer 215 may include a conductive material (e.g., ruthenium) having a dense hexagonal crystal structure.

In some embodiments, the seed layer 215 may include at least one of tantalum (Ta), ruthenium (Ru), titanium (Ti), palladium (Pd), platinum (Pt), magnesium (Mg), aluminum (Al), or a nitride thereof. In some embodiments, the seed layer 215 may be constituted with a multilayer thin film in which different nonmagnetic metals are stacked. For example, the seed layer 215 may include a first nonmagnetic layer and a second nonmagnetic layer that are sequentially stacked. The first nonmagnetic layer may include tantalum (Ta), and the second nonmagnetic layer may include platinum (Pt), but are not limited thereto.

Figure 6:
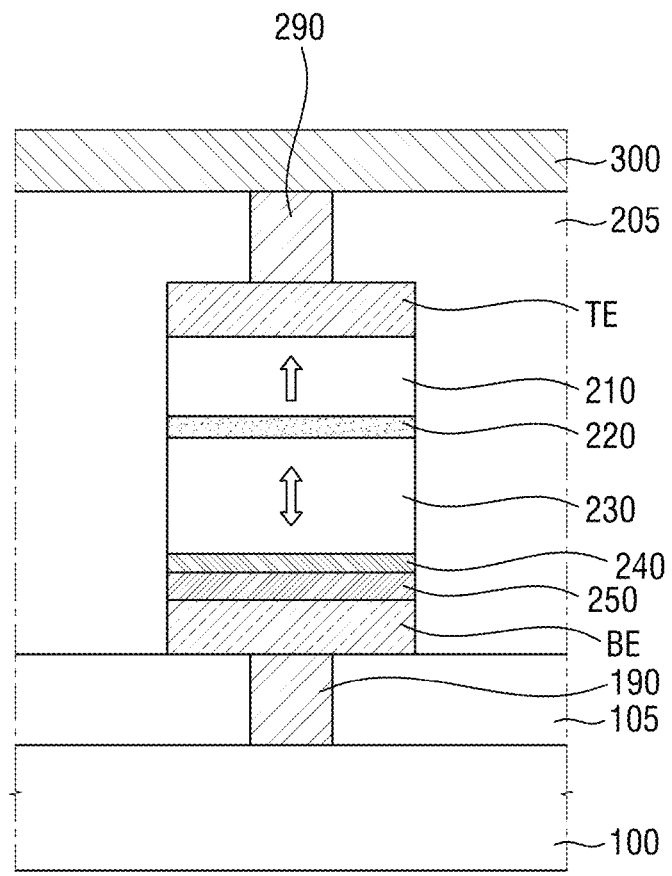

Referring to FIG. 6, in the magnetic memory device according to some embodiments, the free layer 230, the tunnel barrier layer 220, and the pinned layer 210 are sequentially stacked on the substrate 100.

For example, the second oxide layer 250, the first oxide layer 240, the free layer 230, the tunnel barrier layer 220, and the pinned layer 210 may be sequentially stacked on the first interlayer insulating layer 105.

In some embodiments, the second oxide layer 250 may be connected to the substrate 100 through the bottom electrode BE and/or the first contact plug 190. In some embodiments, the pinned layer 210 may be connected to the first wire 300 through the top electrode TE and/or the second contact plug 290.

Figure 7:
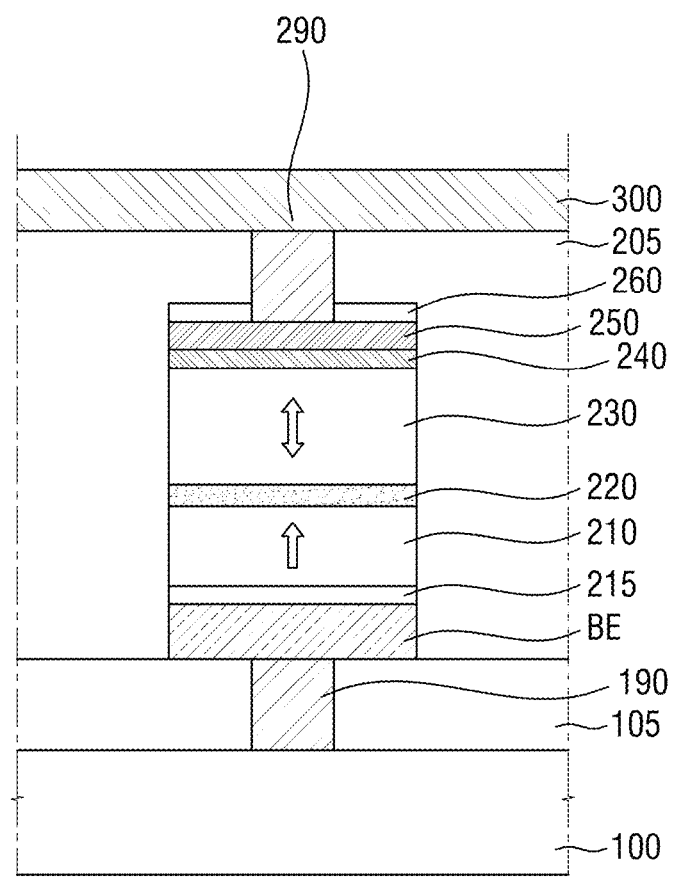

Referring to FIG. 7, the magnetic memory device according to some embodiments further includes a first capping layer 260.

The first capping layer 260 may be formed on the magnetic tunnel junction element. In some embodiments, the first capping layer 260 may cover the top surface of the magnetic tunnel junction element. For example, the first capping layer 260 may cover the top surface of the second oxide layer 250. The first capping layer 260 may be spaced apart from the first oxide layer 240 with the second oxide layer 250 interposed therebetween.

The first capping layer 260 may function as a protective layer protecting the second oxide layer 250. In some embodiments, the first capping layer 260 may include a metal or a metal oxide. The metal may include, for example, at least one of cobalt (Co), nickel (Ni), iron (Fe), tantalum (Ta), tungsten (W), and ruthenium (Ru), but is not limited thereto. The metal oxide may include, for example, at least one of magnesium oxide (MgO), magnesium aluminum oxide (MgAlO), hafnium oxide (HfO), zirconium oxide (ZrO), or aluminum oxide (AlO), but is not limited thereto.

In some embodiments, the second contact plug 290 may penetrate the second interlayer insulating layer 205 and the first capping layer 260 to be connected to the second oxide layer 250.

Figure 8:
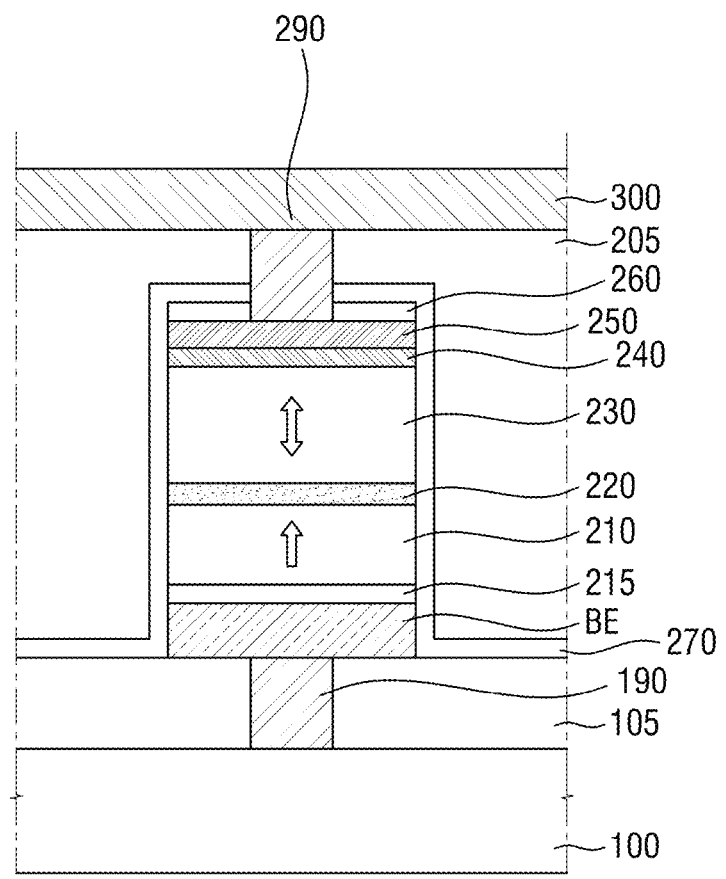

Referring to FIG. 8, the magnetic memory device according to some embodiments further includes a second capping layer 270.

The second capping layer 270 may be formed on the magnetic tunnel junction element. In some embodiments, the second capping layer 270 may cover the side surface and the top surface of the magnetic tunnel junction element. For example, the second capping layer 270 may extend conformally along the pinned layer 210, the tunnel barrier layer 220, the free layer 230, the first oxide layer 240 and the second oxide layer 250. More specifically, the second capping layer 270 may cover the side surface of the pinned layer 210, the side surface of the tunnel barrier layer 220, the side surface of the free layer 230, the side surface of the first oxide layer 240, the side surface of the second oxide layer 250, and the side surface and the top surface of the first capping layer 260.

In some embodiments, the second capping layer 270 may further extend along the first interlayer insulating layer 105. For example, the second capping layer 270 may cover the top surface of the first interlayer insulating layer 105.

The second capping layer 270 may function as a protective layer protecting the magnetic tunnel junction element from moisture or oxidation. For example, the second capping layer 270 may limit and/or prevent the characteristics (e.g., retention, coercive force (Hc), resistance-area product (RA), tunneling magnetoresistance ratio (TMR ratio), etc.) of the magnetic tunnel junction element from deteriorating due to moisture or oxidation. The second capping layer 270 may include, for example, silicon nitride, but is not limited thereto.

In some embodiments, the second interlayer insulating layer 205 may cover the second capping layer 270.

In some embodiments, the second contact plug 290 may penetrate the second interlayer insulating layer 205, the second capping layer 270, and the first capping layer 260 to be connected to the second oxide layer 250.

Figure 9:
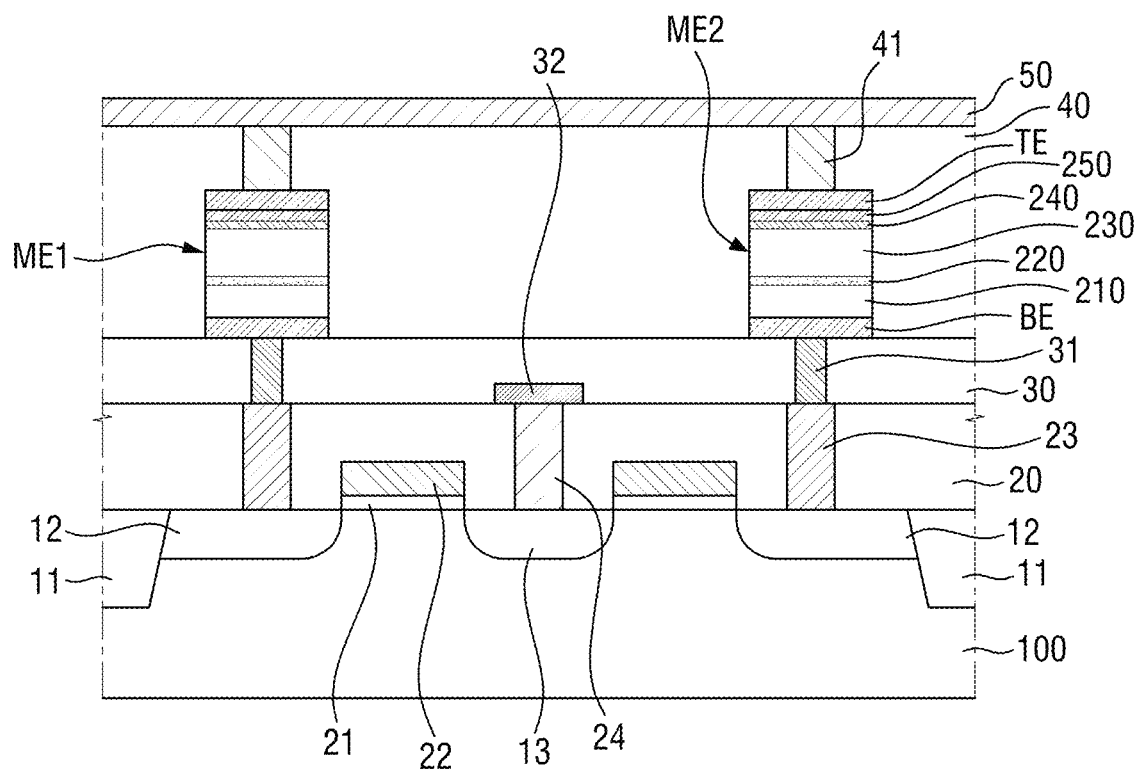
FIG. 9 is a schematic cross-sectional view illustrating a magnetic memory device according to some embodiments.

FIG. 9 is a schematic cross-sectional view illustrating a magnetic memory device according to some embodiments. For simplicity of description, a description overlapping with the description with reference to FIGS. 1 to 8 will be briefly given or omitted. For reference, FIG. 9 illustrates a magnetic memory device constituting an STT-MRAM.

Referring to FIG. 9, a magnetic memory device according to some embodiments includes selection elements 12, 13, 21, and 22, a first magnetic tunnel junction element ME1, and a second magnetic tunnel junction element ME2. The selection elements 12, 13, 21, and 22 are illustrated as being a MOS field effect transistor, but this is only an example, and the technical spirit of the present disclosure is not limited thereto. For example, unlike the illustrated example, a diode or a bipolar transistor may constitute the selection element.

The selection elements 12, 13, 21, and 22 may be formed on the substrate 100. In some embodiments, the selection elements 12, 13, 21, and 22 may include a source region 13, a drain region 12, a gate electrode 22, and a gate insulating layer 21. The source region 13 and the drain region 12 may be spaced apart from each other to be formed in the substrate 100. The gate electrode 22 may be formed on the substrate 100 between the source region 13 and the drain region 12. For example, the gate electrode 22 may extend across the top surface of the substrate 100 to function as a word line (e.g., WL in FIG. 2). The gate electrode 22 may be insulated from the substrate 100 by the gate insulating layer 21. The substrate 100 may include an isolation layer 11 including an insulating material, such as silicon oxide, next to the drain regions 12. As shown in FIG. 9, the isolation layer 11 may define a region of the substrate 100 including the source region 12, the drain region 13, an active region below the gate electrode 22.

A third interlayer insulating layer 20 may be formed on the substrate 100 to cover the selection elements 12, 13, 21, and 22. A source line 32 may be formed on a partial area of the third interlayer insulating layer 20 corresponding to the source region 13. The source line 32 may be formed to extend in the same direction as the gate electrode 22, for example. In FIG. 9, it is illustrated that the adjacent selection elements 12, 13, 21, and 22 share the source line 32, but this is only an example. For example, of course, the source lines 32 corresponding to the respective selection elements 12, 13, 21, and 22 may be provided.

A source line contact 24 and a landing contact 23 may be formed in the third interlayer insulating layer 20. The source line contact 24 may penetrate the third interlayer insulating layer 20 to electrically connect the source line 32 to the source region 13. The landing contact 23 may penetrate the third interlayer insulating layer 20 to be electrically connected to the drain region 12.

A fourth interlayer insulating layer 30 may be formed on the third interlayer insulating layer 20. A third contact plug 31 may be formed in the fourth interlayer insulating layer 30. The third contact plug 31 may penetrate the fourth interlayer insulating layer 30 to be electrically connected to the landing contact 23.

The first magnetic tunnel junction element ME1 and the second magnetic tunnel junction element ME2 may be disposed on the fourth interlayer insulating layer 30. Each of the first magnetic tunnel junction element ME1 and the second magnetic tunnel junction element ME2 may correspond to the magnetic tunnel junction element described above with reference to FIGS. 1 to 8. For example, each of the first magnetic tunnel junction element ME1 and the second magnetic tunnel junction element ME2 may include the pinned layer 210, the tunnel barrier layer 220, the free layer 230, the first oxide layer 240, and the second oxide layer 250.

The first magnetic tunnel junction element ME1 and the second magnetic tunnel junction element ME2 may be electrically connected to the drain region 12, for example, through the bottom electrode BE, the third contact plug 31, and the landing contact 23.

A fifth interlayer insulating layer 40 may be formed on the fourth interlayer insulating layer 30. A second wire 50 may be formed on the fifth interlayer insulating layer 40. The second wire 50, for example, may be electrically connected to the first magnetic tunnel junction element ME1 and the second magnetic tunnel junction element ME2 through a fourth contact plug 41. The second wire 50 may extend to cross the gate electrode 22 to function as a bit line (e.g., BL in FIG. 2).

Each of the third interlayer insulating layer 20, the fourth interlayer insulating layer 30, and the fifth interlayer insulating layer 40 may include an insulating material, for example, silicon oxide or silicon oxynitride, but is not limited thereto. The landing contact 23, the source line contact 24, the source line 32, the third contact plug 31, the fourth contact plug 41, and the second wire 50 may include a conductive material, for example, tungsten (W), ruthenium (Ru), tantalum (Ta), copper (Cu), aluminum (Al), or doped polysilicon, but are not limited thereto.

Although not illustrated, metal wires electrically connected to circuits of a peripheral circuit unit (not illustrated) may be further formed on the second wire 50.

Hereinafter, a method for fabricating a magnetic tunnel junction element and a magnetic memory device according to some embodiments of the present disclosure will be described with reference to FIGS. 1 to 14.

FIGS. 10 to 14 are diagrams illustrating the intermediate steps of a method for fabricating a magnetic memory device according to some embodiments. For simplicity of description, a description overlapping with the description with reference to FIGS. 1 to 9 will be briefly given or omitted.

Figure 10:
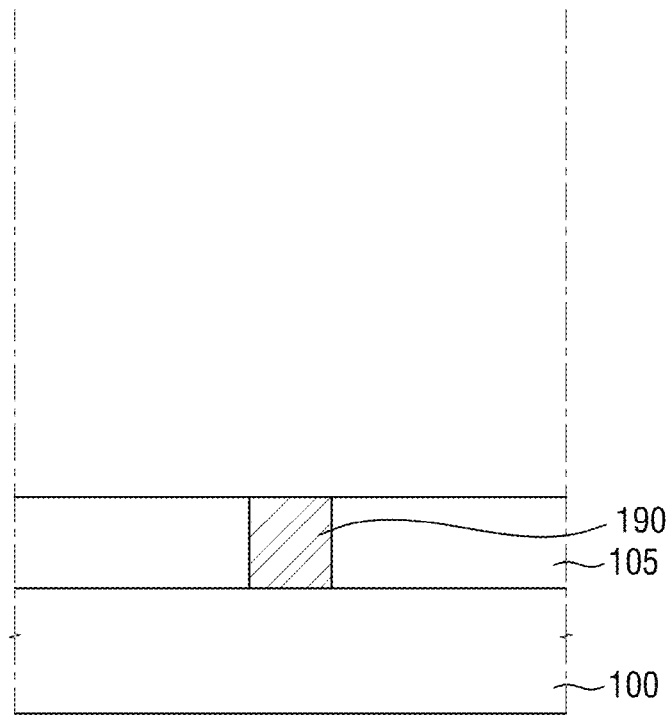
FIGS. 10 to 14 are diagrams illustrating the intermediate steps of a method for fabricating a magnetic memory device according to some embodiments.

Referring to FIG. 10, the first interlayer insulating layer 105 and the first contact plug 190 are formed on the substrate 100.

For example, a first interlayer insulating layer 105 may be formed on the substrate 100. Subsequently, the first contact plug 190 that penetrates the first interlayer insulating layer 105 to be connected to the substrate 100 may be formed.

Figure 11:
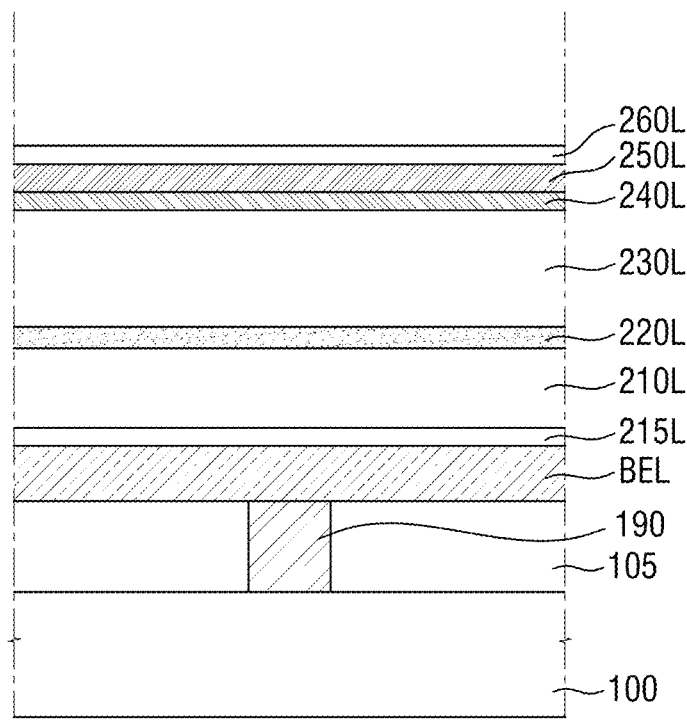

Referring to FIG. 11, a preliminary pinned layer 210L, a preliminary tunnel barrier layer 220L, a preliminary free layer 230L, a first preliminary oxide layer 240L, and a second preliminary oxide layer 250L are formed on the substrate 100.

In some embodiments, the preliminary pinned layer 210L, the preliminary tunnel barrier layer 220L, the preliminary free layer 230L, the first preliminary oxide layer 240L, and the second preliminary oxide layer 250L may be sequentially stacked on the first interlayer insulating layer 105.

The preliminary pinned layer 210L, the preliminary tunnel barrier layer 220L, and the preliminary free layer 230L may include the same material as the pinned layer 210, the tunnel barrier layer 220, and the free layer 230 described above in the description of FIGS. 3 and 4, respectively. For example, the preliminary pinned layer 210L may include CoFeB, the preliminary tunnel barrier layer 220L may include MgO, and the preliminary free layer 230L may include CoFeB.

Each of the preliminary pinned layer 210L, the preliminary tunnel barrier layer 220L, and the preliminary free layer 230L may be formed by, for example, a physical vapor deposition (PVD) process (e.g., a sputtering process), a chemical vapor deposition (CVD) process, or an atomic layer deposition (ALD) process, but is not limited thereto.

The first preliminary oxide layer 240L may include a first material having a first oxygen affinity. The first material may include, for example, at least one of a metal such as calcium (Ca), strontium (Sr), beryllium (Be), magnesium (Mg), hafnium (Hf), zirconium (Zr), barium (Ba) and aluminum (Al), boride of the metal (e.g., calcium boride (CaB), aluminum boride (AlB), and zirconium boride (ZrB)), tantalum boride (TaB), titanium boride (TiB), or tantalum carbide (TaC), but is not limited thereto.

The first preliminary oxide layer 240L may include an oxide of the first material. For example, the first preliminary oxide layer 240L may be a native oxide of the first material.

The second preliminary oxide layer 250L may include a second material having a second oxygen affinity smaller than the first oxygen affinity. The second material may include, for example, at least one of titanium (Ti), tantalum (Ta), gallium (Ga), vanadium (V), zinc (Zn), manganese (Mn), or niobium (Nb), but is not limited thereto. In some embodiments, the second material may be different from the first material.

The second preliminary oxide layer 250L may include an oxide of the second material. For example, the second preliminary oxide layer 250L may be a native oxide of the second material.

In some embodiments, each of the first preliminary oxide layer 240L and the second preliminary oxide layer 250L may be formed by a deposition process. For example, each of the first preliminary oxide layer 240L and the second preliminary oxide layer 250L may be formed by a PVD process, a CVD process, or an ALD process, but is not limited thereto.

In some embodiments, a bottom electrode layer BEL may be further formed on the first interlayer insulating layer 105. For example, before the preliminary pinned layer 210L is formed, the bottom electrode layer BEL extending along the top surface of the first interlayer insulating layer 105 and the top surface of the first contact plug 190 may be formed. The bottom electrode layer BEL may include the same material as the bottom electrode BE described above with reference to FIGS. 3 and 4.

In some embodiments, the preliminary seed layer 215L may be further formed on the first interlayer insulating layer 105. For example, before the preliminary pinned layer 210L is formed, the preliminary seed layer 215L extending along the top surface of the bottom electrode layer BEL may be formed. The preliminary seed layer 215L may function as a seed layer of the preliminary pinned layer 210L. The preliminary seed layer 215L may include the same material as the seed layer 215 described above in the description of FIG. 5.

In some embodiments, a preliminary capping layer 260L may be further formed on the second preliminary oxide layer 250L. For example, after the second preliminary oxide layer 250L is formed, the preliminary capping layer 260L extending along the top surface of the second preliminary oxide layer 250L may be formed. The preliminary capping layer 260L may function as a protective layer protecting the second preliminary oxide layer 250L. The preliminary capping layer 260L may include the same material as the first capping layer 260 described above in the description of FIG. 7.

Figure 12:
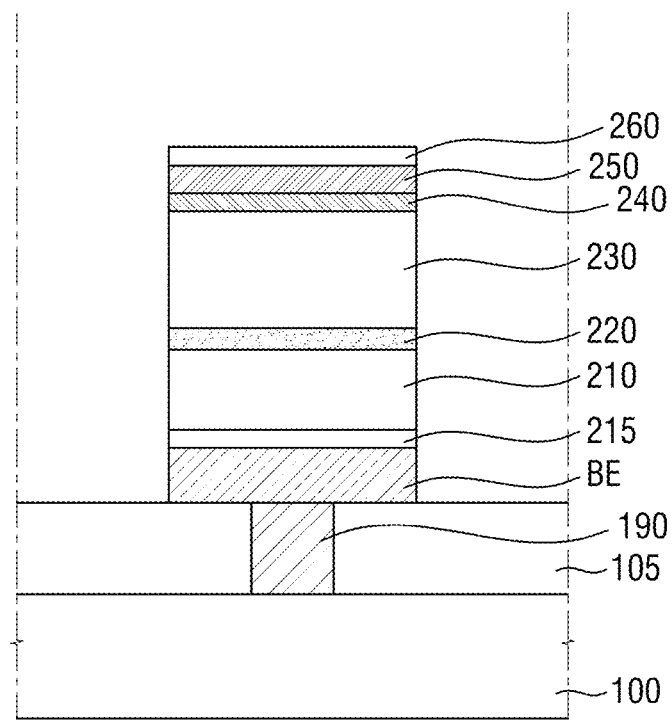

Referring to FIG. 12, the pinned layer 210, the tunnel barrier layer 220, the free layer 230, the first oxide layer 240, and the second oxide layer 250 are formed on the substrate 100.

For example, the preliminary pinned layer 210L, the preliminary tunnel barrier layer 220L, the preliminary free layer 230L, the first preliminary oxide layer 240L, and the second preliminary oxide layer 250L of FIG. 11 may be patterned. Accordingly, a magnetic tunnel junction element including the pinned layer 210, the tunnel barrier layer 220, the free layer 230, the first oxide layer 240, and the second oxide layer 250 may be formed.

In some embodiments, the bottom electrode layer BEL, the preliminary seed layer 215L, and the preliminary capping layer 260L may be patterned together with the preliminary pinned layer 210L, the preliminary tunnel barrier layer 220L, the preliminary free layer 230L, the first preliminary oxide layer 240L, and the second preliminary oxide layer 250L. Accordingly, the bottom electrode BE, the seed layer 215 and the first capping layer 260 may be formed.

Figure 13:
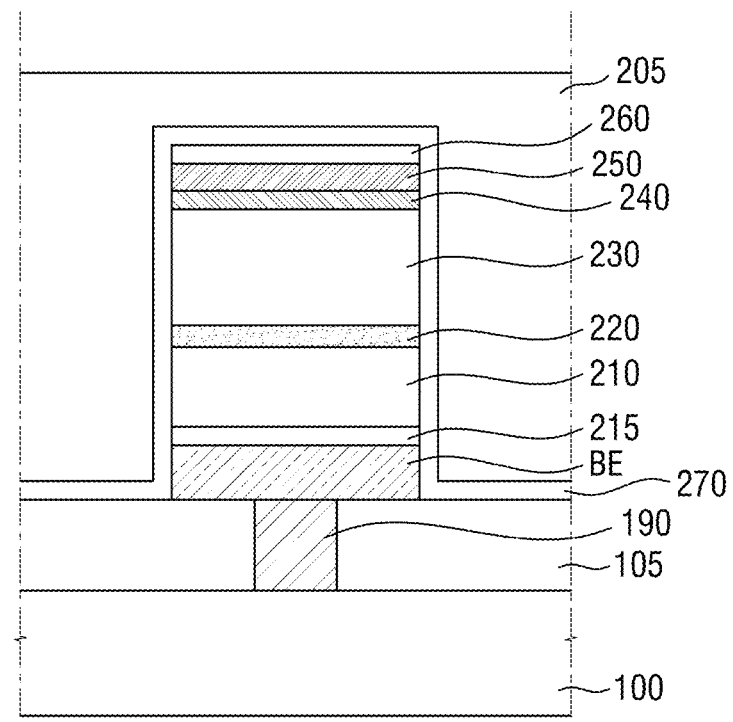

Referring to FIG. 13, the second capping layer 270 and the second interlayer insulating layer 205 are formed on the substrate 100.

For example, the second capping layer 270 may cover the side surface of the pinned layer 210, the side surface of the tunnel barrier layer 220, the side surface of the free layer 230, the side surface of the first oxide layer 240, the side surface of the second oxide layer 250, and the side surface and the top surface of the first capping layer 260. In some embodiments, the second capping layer 270 may cover the top surface of the first interlayer insulating layer 105.

The second interlayer insulating layer 205 may cover the first interlayer insulating layer 105, the pinned layer 210, the tunnel barrier layer 220, the free layer 230, the first oxide layer 240, and the second oxide layer 250. For example, the second interlayer insulating layer 205 may cover the second capping layer 270.

Figure 14:
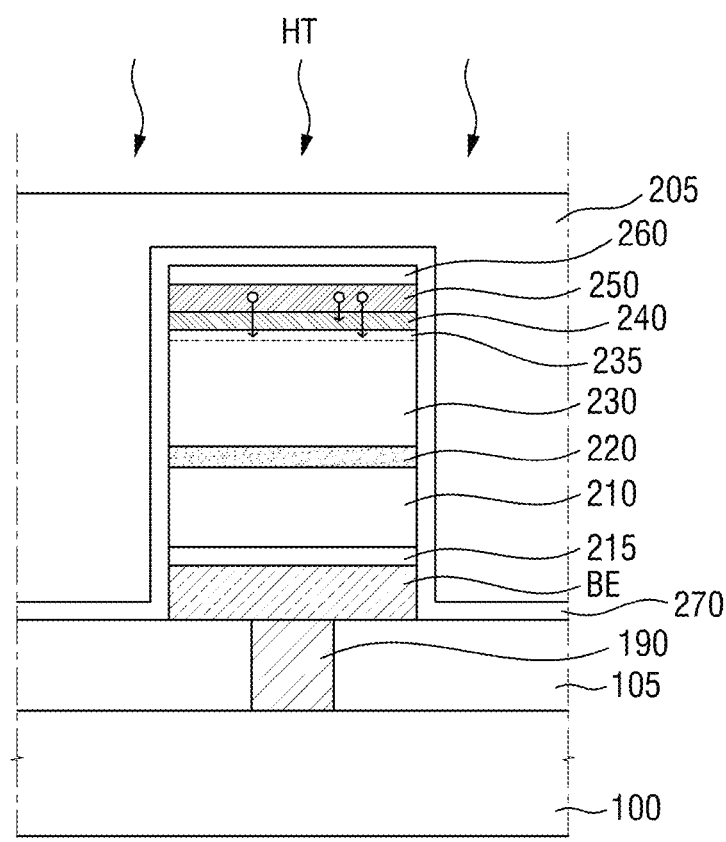

Referring to FIG. 14, a heat treatment process is performed.

The heat treatment process may include, for example, an annealing process, but is not limited thereto.

Through the heat treatment process, the second oxide layer 250 may supply oxygen atoms to the interface between the free layer 230 and the first oxide layer 240. The oxygen atoms supplied from the second oxide layer 250 may be combined with magnetic atoms (e.g., iron (Fe) atoms) of the free layer 230 to induce interfacial perpendicular magnetic anisotropy (i-PMA). For example, the interfacial layer 235 may bond with oxygen atoms supplied from the second oxide layer 250 to induce interfacial perpendicular magnetic anisotropy (i-PMA). In some embodiments, the interfacial layer 235 may include iron-oxygen (Fe—O) bonds.

During the heat treatment process, the first oxide layer 240 may control oxygen atoms supplied from the second oxide layer 250 to the free layer 230. Since the first oxide layer 240 has a greater oxygen affinity than the second oxide layer 250, and the first oxide layer 240 may limit and/or prevent oxygen atoms from excessively diffusing inside the free layer 230 and/or into the tunnel barrier layer 220. In addition, the first oxide layer 240 and the second oxide layer 250 may be bonded to each other, so that oxygen atoms may be controlled to be uniformly provided to the free layer 230.

Accordingly, a method for fabricating a magnetic memory device with improved product reliability, performance, and distribution may be provided.

While some example embodiments have been described, the presented embodiments of the disclosure are to be used in a generic and descriptive sense only and not for purposes of limitation. Those skilled in the art will appreciate that many variations and modifications may be made to embodiments of inventive concepts without substantially departing from the principles of inventive concepts in the present disclosure as defined by the following claims.

What is claimed is:

1. A magnetic memory device comprising:
   a pinned layer;
   a free layer;
   a tunnel barrier layer between the pinned layer and the free layer;
   a first oxide layer spaced apart from the tunnel barrier layer with the free layer therebetween, the first oxide layer including an oxide of a first material, the first material having a first oxygen affinity, and the first oxide layer having a thickness of 0.3 Å to 2.0 Å; and
   a second oxide layer spaced apart from the free layer with the first oxide layer therebetween, the second oxide layer including an oxide of a second material, the second material having a second oxygen affinity that is less than the first oxygen affinity, and the second oxide layer having a thickness of 0.1 Å to 5.0 Å.

2. The magnetic memory device of claim 1, wherein a first oxide decomposition potential of the oxide of the first material is greater than a second oxide decomposition potential of the oxide of the second material.

3. The magnetic memory device of claim 1, wherein the free layer includes a magnetic element that is configured to bond with oxygen and induce interfacial perpendicular magnetic anisotropy (i-PMA).

4. The magnetic memory device of claim 1, further comprising:
   a substrate, wherein
   the pinned layer, the free layer, the tunnel barrier layer, the first oxide layer, and the second oxide layer are sequentially stacked on the substrate.

5. The magnetic memory device of claim 4, further comprising:
   a seed layer under a bottom surface of the pinned layer; and a first capping layer covering a top surface of the second oxide layer.

6. The magnetic memory device of claim 5, further comprising:
a second capping layer covering a side surface of the seed layer, a side surface of the pinned layer, a side surface of the free layer, a side surface of the tunnel barrier layer, a side surface of the first oxide layer, a side surface of the second oxide layer, and a side surface and a top surface of the first capping layer.

7. The magnetic memory device of claim 6, wherein the second capping layer includes silicon nitride.

8. The magnetic memory device of claim 1, wherein
the first oxide layer is a native oxide of the first material, and
the second oxide layer is a native oxide of the second material.

9. The magnetic memory device of claim 1, wherein
the free layer and the first oxide layer contain boron (B), and
the second oxide layer does not contain boron (B).

10. The magnetic memory device of claim 9, wherein a boron concentration of the free layer is smaller than a boron concentration of the first oxide layer.

11. The magnetic memory device of claim 10, wherein the boron concentration of the free layer is 30 at % or less, and the boron concentration of the first oxide layer is 50 at % or less.

12. A magnetic memory device comprising:
a pinned layer;
a free layer;
a tunnel barrier layer between the pinned layer and the free layer;
a first oxide layer spaced apart from the tunnel barrier layer with the free layer therebetween, and the first oxide layer including a first material including at least one of calcium (Ca), strontium (Sr), magnesium (Mg), hafnium (Hf), zirconium (Zr) and aluminum (Al), the first material having a first oxygen affinity; and
a second oxide layer spaced apart from the free layer with the first oxide layer therebetween, the second oxide layer including a second material different from the first material, the second material having a second oxygen affinity that is less than the first oxygen affinity, wherein
the first oxide layer is in contact with the free layer, or the second oxide layer is in contact with the first oxide layer, or both the first oxide layer is in contact with the free layer and the second oxide layer is in contact with the first oxide layer.

13. The magnetic memory device of claim 12, wherein the second material includes at least one of titanium (Ti), tantalum (Ta), gallium (Ga), vanadium (V) and zinc (Zn).

14. The magnetic memory device of claim 12, wherein the first oxide layer has a thickness of 0.3 Å to 2.0 Å, and the second oxide layer has a thickness of 0.1 Å to 5.0 Å.

15. The magnetic memory device of claim 12, wherein
the free layer includes an interfacial layer in contact with the first oxide layer, and
the interfacial layer is configured to induce interfacial perpendicular magnetic anisotropy (i-PMA).

16. A magnetic memory device comprising:
a pinned layer;
a free layer;
a tunnel barrier layer between the pinned layer and the free layer;
a first oxide layer spaced apart from the tunnel barrier layer with the free layer therebetween, the first oxide layer including a first metal oxide having a first oxide decomposition potential; and
a second oxide layer spaced apart from the free layer with the first oxide layer therebetween, the second oxide layer including a second metal oxide different from the first metal oxide, the second metal oxide having a second oxide decomposition potential that is less than the first oxide decomposition potential, wherein
the first oxide layer is in contact with the free layer, or the second oxide layer is in contact with the first oxide layer, or both the first oxide layer is in contact with the free layer and the second oxide layer is in contact with the first oxide layer.

17. The magnetic memory device of claim 16, wherein a difference between the first oxide decomposition potential and the second oxide decomposition potential is 0.1 V or more.

18. The magnetic memory device of claim 16, wherein
the first oxide decomposition potential at 1300 K is 2.1 V or more, and
the second oxide decomposition potential at 1300 K is 2.0 V or less.

19. The magnetic memory device of claim 16, wherein
the first oxide layer has a thickness of 0.3 Å to 2.0 Å, and
the second oxide layer has a thickness of 0.1 Å to 5.0 Å.

20. The magnetic memory device of claim 16, wherein the free layer includes iron (Fe),
the first metal oxide includes at least one of calcium (Ca), strontium (Sr), magnesium (Mg), hafnium (Hf), zirconium (Zr) and aluminum (Al), and
the second metal oxide includes at least one of titanium (Ti), tantalum (Ta), gallium (Ga), vanadium (V) and zinc (Zn).

* * * * *